(12) United States Patent
Zheng et al.

(10) Patent No.: US 10,984,732 B2
(45) Date of Patent: Apr. 20, 2021

(54) ELECTRONIC DEVICES HAVING AMBIENT LIGHT SENSORS WITH HOLD FUNCTION

(71) Applicant: Apple Inc., Cupertino, CA (US)

(72) Inventors: Dong Zheng, Los Altos, CA (US); Ali Motamed, San Francisco, CA (US); Anand K. Chamakura, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/580,150

(22) Filed: Sep. 24, 2019

(65) Prior Publication Data

US 2021/0090509 A1   Mar. 25, 2021

(51) Int. Cl.
G09G 3/36     (2006.01)
G09G 3/34     (2006.01)
H03F 3/45     (2006.01)

(52) U.S. Cl.
CPC ....... G09G 3/3406 (2013.01); H03F 3/45071 (2013.01); *G09G 2320/0646* (2013.01); *G09G 2360/144* (2013.01)

(58) Field of Classification Search
None
See application file for complete search history.

(56) References Cited

U.S. PATENT DOCUMENTS

| | | |
|---|---|---|
| 7,808,474 B2 | 10/2010 | Mizuno et al. |
| 8,432,340 B2 | 4/2013 | Okita et al. |
| 8,759,739 B2 | 6/2014 | Tanaka et al. |
| 8,970,571 B1 | 3/2015 | Wong et al. |
| 8,987,652 B2 | 3/2015 | Zheng |
| 9,620,571 B2 | 4/2017 | Shedletsky et al. |
| 9,947,901 B2 | 4/2018 | Shedletsky et al. |
| 10,412,813 B1 | 9/2019 | Chen et al. |
| 2010/0060562 A1* | 3/2010 | Hadwen ............ H01L 31/02164 345/102 |
| 2011/0163233 A1* | 7/2011 | Ng ............................. G01J 5/20 250/338.4 |
| 2011/0315859 A1 | 12/2011 | Tanaka |
| 2014/0166850 A1* | 6/2014 | Zheng .................. G09G 3/3406 250/205 |
| 2016/0380598 A1* | 12/2016 | McLeod ............... A61B 5/0488 600/509 |
| 2018/0157084 A1* | 6/2018 | Uehara .................. G06F 3/0416 |

* cited by examiner

*Primary Examiner* — Kirk W Hermann
(74) *Attorney, Agent, or Firm* — Treyz Law Group, P.C.; Jason Tsai

(57) ABSTRACT

An electronic device may have a display with an array of pixels configured to display images for a user. The electronic device may have an ambient light sensor for gathering ambient light information. The ambient light sensor may be at least partially covered by the display. The ambient light sensor may be switched into use during blanking periods when a portion of the display overlapping with the display is temporarily turned off. The ambient light sensor may include a photodetector, a first stage with an amplifier, first and second capacitors selectively coupled across the amplifier, and a second accumulation stage. During blanking time, the first capacitor may integrate photodetector current. During non-blanking, the charge stored in the first capacitor may be transferred to the second accumulation stage while the second capacitor applies an offset voltage to the photodetector to prevent undesired charge injection into the photodetector.

17 Claims, 12 Drawing Sheets

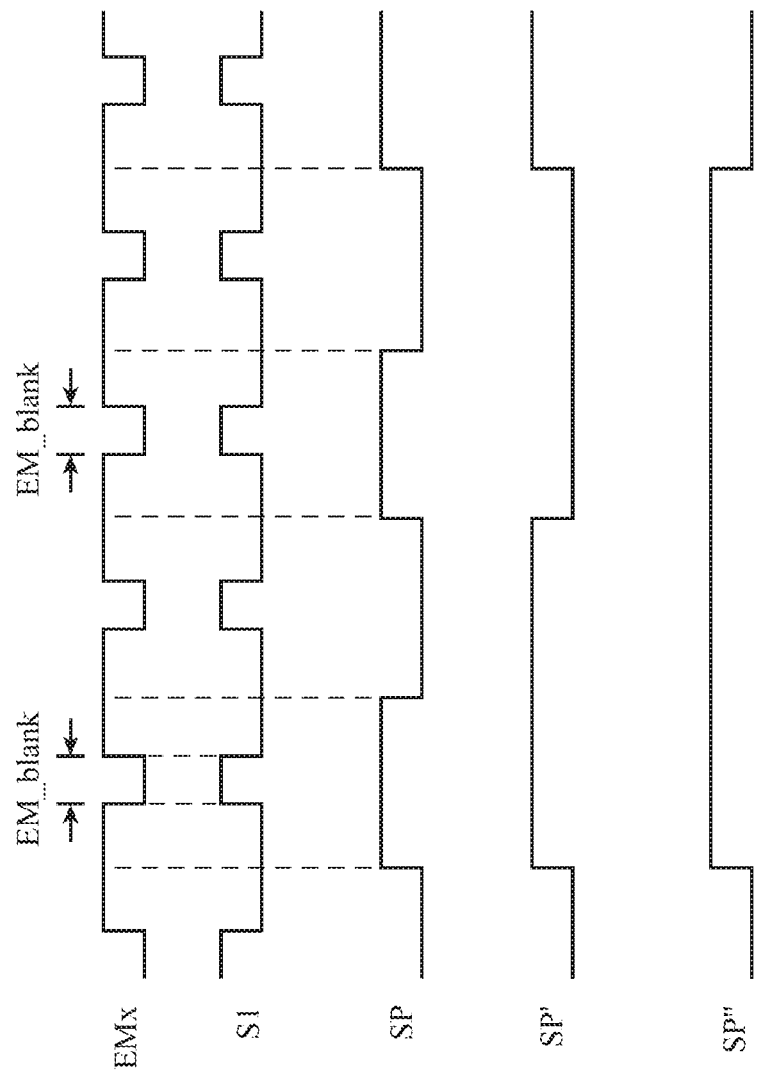

ELECTRONIC DEVICES HAVING AMBIENT LIGHT SENSORS WITH HOLD FUNCTION

BACKGROUND

This relates generally to electronic devices, and, more particularly, to electronic devices with light sensors.

Electronic devices such as laptop computers, cellular telephones, and other equipment are sometimes provided with light sensors. For example, ambient light sensors may be incorporated into a device to provide the device with information on current lighting conditions. Ambient light readings may be used in controlling the device. If, for example bright daylight conditions are detected, an electronic device may increase display brightness to compensate.

It can be challenging to incorporate ambient light sensors into electronic devices. If care is not taken, an ambient light sensor may consume more space in an electronic device than desired. In some arrangements, there may be challenges associated with operating an ambient light sensor accurately due to potential interference from other components. For instance, an ambient light sensor that is placed under a display in an electronic device might receive stray light emitted from the display which will degrade the accuracy of the ambient light sensor.

SUMMARY

An electronic device may include a display having rows of pixels and an ambient light sensor at least partially overlapping with the display. The ambient light sensor may include a photosensitive element, an integrating stage having an amplifier, and an accumulation stage configured to receive signals from the integrating stage. The integrating stage may be configured to integrate charge generated from the photosensitive element during a blanking period when at least some of the rows in the display overlapping with the ambient light sensor are not emitting light. The charge integrated at the integrating stage during the blanking period may be transferred to the accumulation stage during a non-blanking period when the at least some of the rows in the display overlapping with the ambient light sensor are emitting light. The accumulation stage may accumulate charge transferred from the integrating stage in either the digital domain or the analog domain.

The amplifier may exhibit an input offset voltage. The photosensitive device is subjected to an input off of the integrating stage during integration. The integrating stage may be configured to apply the input offset voltage of the amplifier to the photosensitive element during both the blanking period and the non-blanking period to prevent undesired charge from being injected into the photosensitive element during a transition between the blanking period and the non-blanking period. For example, the integrating stage may include a first feedback capacitor configured to integrate charge generated from the photosensitive element during the blanking period and a second feedback capacitor that is used to maintain a feedback loop across the amplifier to maintain the input offset voltage at the photosensitive element during the non-blanking period.

In another suitable arrangement, the ambient light sensor may include a first differential amplifier having an input offset voltage, first integration capacitors coupled across the differential amplifier, and a first input swapping circuit coupled at the input of the differential amplifier. The first input swapping circuit is configured to swap signals arriving at the first differential amplifier in an alternating fashion to average and cancel out the input offset voltage of the first differential amplifier. The ambient light sensor may further include a second differential amplifier coupled in series with the first differential amplifier, second integration capacitors coupled across the second differential amplifier, and a second input swapping circuit interposed between the first differential amplifier and the second differential amplifier. The first and second input swapping circuits may be adjusted using the same control signal that toggles only an even number of times to average out over time the input offset voltage associated with the first and second differential amplifiers.

BRIEF DESCRIPTION OF THE DRAWINGS

FIG. 7B is a timing diagram showing illustrative signal waveforms for operating the integrator shown in FIG. 7A in accordance with an embodiment.

DETAILED DESCRIPTION

Figure 1:
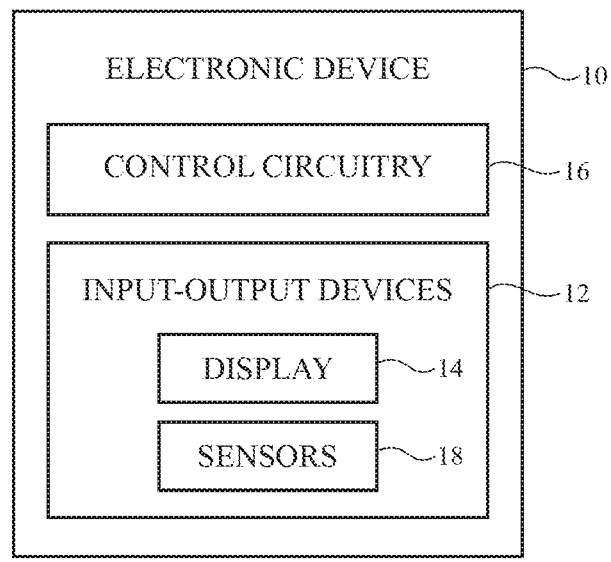
FIG. 1 is a schematic diagram of an illustrative electronic device having display and sensor components in accordance with an embodiment.

An illustrative electronic device of the type that may be provided with one or more light sensors is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wristwatch or other device worn on a user's wrist, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc. Control circuitry 16 may include communications circuitry for supporting wired and/or wireless communications between device 10 and external equipment. For example, control circuitry 16 may include wireless communications circuitry such as cellular telephone communications circuitry and wireless local area network communications circuitry.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Input-output devices 12 may also include sensors 18. Sensors 18 may include a capacitive sensor, a light-based proximity sensor, a magnetic sensor, an accelerometer, a force sensor, a touch sensor, a temperature sensor, a pressure sensor, a compass, a microphone, a radio-frequency sensor, a three-dimensional image sensor, a camera, a light-based position sensor (e.g., a lidar sensor), and other sensors. Sensors 18 may also include one or more light detectors that are configured to detect ambient light. Sensors 18 may, for example, include one or more monochrome ambient light sensors and one or more color ambient light sensors that are configured to measure ambient light from the environment in which device 10 is operated. A monochrome ambient light sensor may be used to measure ambient light intensity. A color ambient light sensor may be used to measure the color (e.g., color spectrum, color temperature, color coordinates, etc.) of ambient light and may be used to measure ambient light intensity.

Electronic device 10 may include one or more ambient light sensors. Illustrative arrangements in which device 10 includes a single ambient light sensor are sometimes described herein as an example. In some configurations, the ambient light sensor may be located in a portion of device 10 where there is a potential for light interference from light-emitting components in device 10 that emit stray light. For example, the ambient light sensor may be overlapped by a pixel array in display 14 (e.g., an active area of the display that is configured to display images) that has a potential to generate stray light. The pixel array may have transparent portions (e.g., transparent gaps between metal traces and other opaque structures) or may have a window opening so that ambient light may pass through the pixel array to the overlapped ambient light sensor. By locating the ambient light sensor behind the active area of the display, the appearance of device 10 may be enhanced and/or more area can be freed up for other components and functions. Configurations in which the ambient light sensor is located under an inactive display area (e.g., a notch or pixel array window opening that is free of pixels) or is located elsewhere within device 10 may also be used.

During operation, control circuitry 16 can gather measurements with the ambient light sensor while controlling display 14 or other light source that generates stray light. Control circuitry 16 can then process the data gathered from the ambient light sensor to produce accurate ambient light measurements even in scenarios in which sensor data has been gathered in the presence of stray display light or other stray light that has the potential to interfere with ambient light sensor readings.

Figure 2:
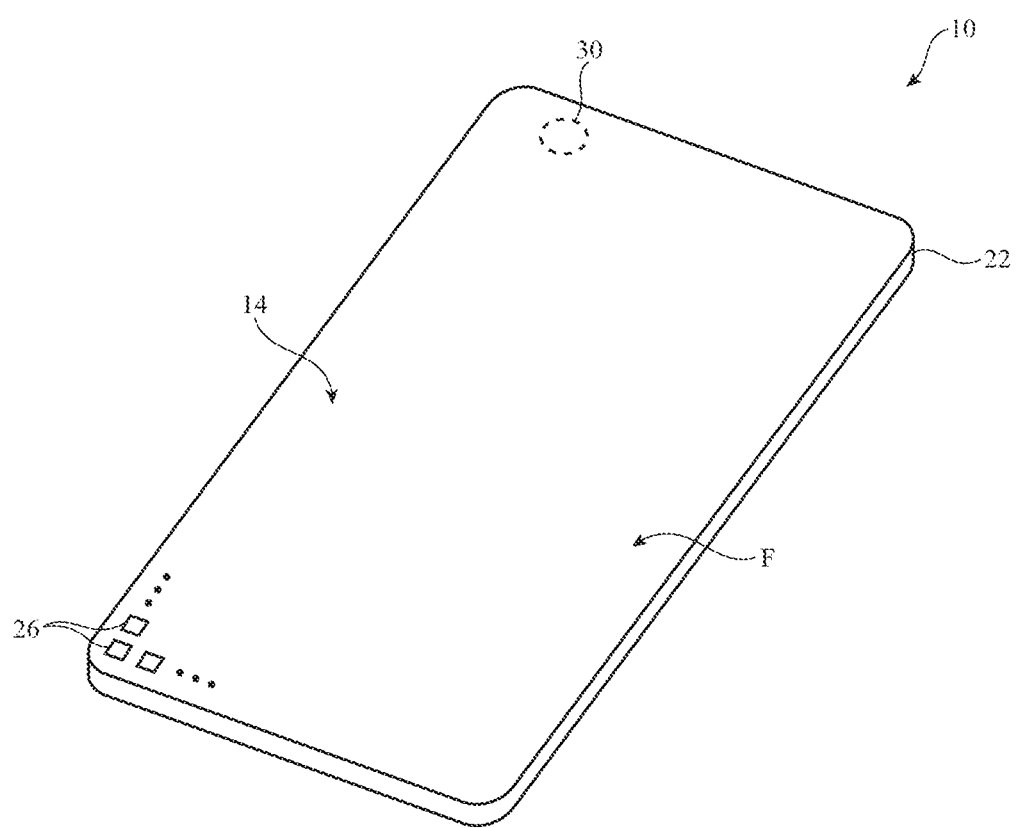
FIG. 2 is a perspective view of an electronic device with an ambient light sensor in accordance with an embodiment.

A perspective view of an illustrative electronic device of the type that may include an ambient light sensor is shown in FIG. 2. In the example of FIG. 2, device 10 includes a display such as display 14 mounted in housing 22. Display 14 may be a liquid crystal display, an electrophoretic display, an organic light-emitting diode display, or other display with an array of light-emitting diodes (e.g., a display that includes pixels having diodes formed from crystalline semiconductor dies), may be a plasma display, may be an electrowetting display, may be a display based on microelectromechanical systems (MEMs) pixels, or may be any other suitable display. Display 14 may have an array of pixels 26 that extend across some or all of front face F of device 10 and/or other external device surfaces. The pixel array may be rectangular or may have other suitable shapes. Display 14 may be protected using a display cover layer (e.g., a transparent front housing layer) such as a layer of transparent glass, clear plastic, sapphire, or other clear layer. The display cover layer may overlap the array of pixels 26.

Housing 22, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 22 and display 14 may separate an interior region of device 10 from an exterior region surrounding device 10. Housing 22 may be formed using a unibody configuration in which some or all of housing 22 is machined or molded as a single structure or may be formed using multiple structures (e.g., an internal frame structure, one or more structures that form exterior housing surfaces, etc.). If desired, a wristband or other strap may be coupled to a main portion of housing 22 (e.g., in configurations in which device 10 is a wristwatch).

Pixels 26 may cover substantially all of the front face of device 10 or display 14 may have inactive areas (e.g., notches, recessed area, rectangular areas, or other regions)

that are free of pixels 26. The inactive areas may be used to accommodate an opening for a speaker and windows for optical components such as image sensors, an ambient light sensor, an optical proximity sensor, a three-dimensional image sensor such as a structured light three-dimensional image sensor, a camera flash, etc. In an illustrative configuration, pixels 26 may extend over the entirety of the front surface F of device 10 and may overlap an ambient light sensor in region 30. In this type of arrangement, ambient light may pass to the ambient light sensor in region 30 through the array of pixels 26 in display 14.

Figure 3:
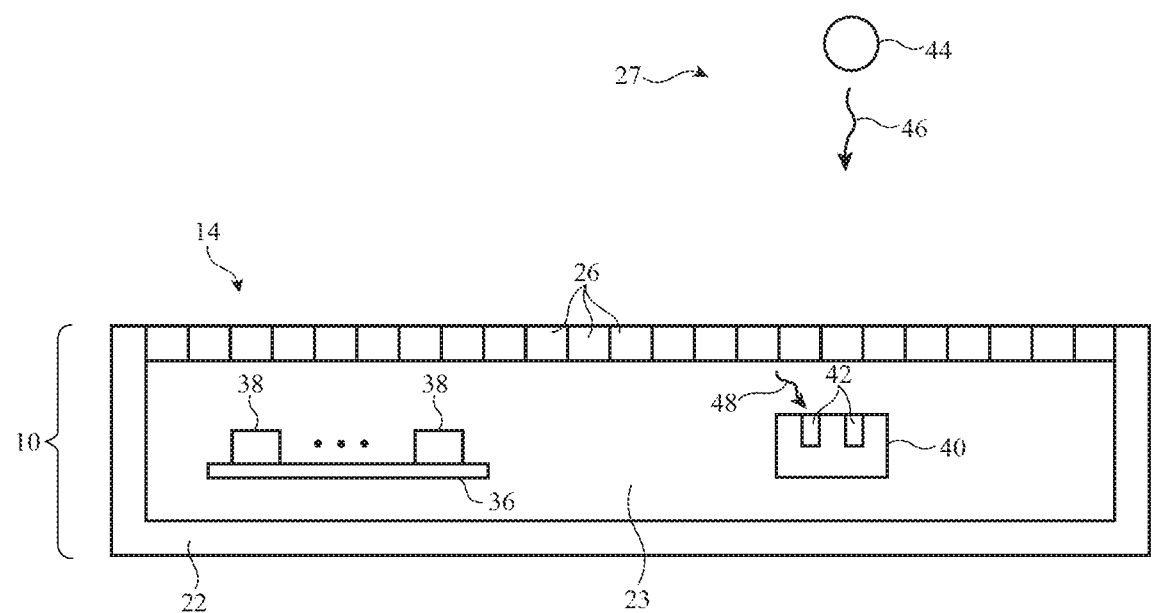
FIG. 3 is a cross-sectional side view of an illustrative electronic device with a display and an ambient light sensor in accordance with an embodiment.

FIG. 3 is a cross-sectional side view of device 10 of FIG. 2 in an illustrative configuration in which pixels 26 overlap ambient light sensor 40. As shown in FIG. 3, ambient light sensor 40 may have one or more photodetectors 42. A single photodetector 42 (or set of photodetectors 42) may be used to make monochromatic light measurements (e.g., measurements of light intensity) or a set of photodetectors 42 that have color filters of different respective colors may be used to make intensity and color measurements on ambient light 46. Ambient light sensor 40 may be mounted in interior region 23 of housing 22 under display 14. Display 14 and housing 22 may separate interior region 23 from exterior region 27 surrounding device 10. Electrical components 38 (see, e.g., control circuitry 16 and input-output devices 12 of FIG. 1) may be mounted within interior region 23 (e.g., on one or more printed circuits such as printed circuit 36).

Display 14 has an array of pixels 26. Pixels 26 extend over front face F of device 10 and form an active area for display 14 in which images are displayed. A display cover layer (e.g., a layer of glass, crystalline material such as sapphire, polymer, etc.) may at least partially cover and overlap pixels 26. Each pixel 26 may be formed from thin-film transistors and other components (e.g., liquid crystal display pixel components such as pixel electrodes, light-emitting diode pixel components such as light-emitting diodes, etc.). Metal traces and other opaque structures in pixels 26 may block light; however, the array of pixels 26 may also include transparent regions between the opaque structures. The presence of transparent areas in display 14 allows ambient light 46 from external light sources such as external light source 44 in exterior region 27 to pass through the array of pixels 26 to reach ambient light sensor 40 in interior region 23. Window openings, notches, and other structures may also be formed in display 14 to allow ambient light to pass to ambient light sensor 40.

As the example of FIG. 3 demonstrates, ambient light sensor 40 may, in some configurations, be mounted under display 14. In this location within interior 23 of housing 22, the active area of display 14 that is formed by pixels 26 overlaps ambient light sensor 40 when viewed from the exterior of device 10 (e.g., when viewing front face F). By mounting ambient light sensor 40 behind pixels 26 in this way, the overall size of device 10 can be reduced, the appearance of device 10 may be enhanced, and inactive display area may be reduced. If desired, ambient light sensor 40 may be located adjacent to display 14 without receiving ambient light through display 14 (e.g., ambient light sensor 40 may be near to display 14 but not overlapped by pixels 26). Arrangements in which ambient light sensor 40 receives ambient light through an overlapping display may sometimes be described as an example.

During operation of display 14 to display an image for a user, pixels 26 of display 14 emit light such as stray display light 48. Some of light 48 from display 14 may pass through interior region 23 to ambient light sensor 40 or may otherwise reach ambient light sensor 40. This stray light therefore represents a source of noise that has the potential to interfere with accurate measurements of ambient light 46 by ambient light sensor 40. Stray light also represents a source of noise in configurations in which display 14 and ambient light sensor are located near to each other but do not overlap.

Control circuitry 16 may gather measurements with ambient light sensor 40 while controlling display 14. In this way, control circuitry 16 can help discriminate between contributions to ambient light sensor measurements from sensor 40 that are due to ambient light 46 and contributions to the ambient light sensor measurements from sensor 40 that are due to display light 48. In one suitable arrangement, control circuitry 16 may intermittently turn off the display during emission blanking intervals, and ambient light sensor 40 can then be used to measure ambient light during the emission blanking intervals while the display is temporarily deactivated. Since the display does not emit light during the emission blanking intervals, ambient light measurements obtained by ambient light sensor 40 in this way will be free of noise and crosstalk that would otherwise be present due to stray light emitted from the display.

Figure 4:
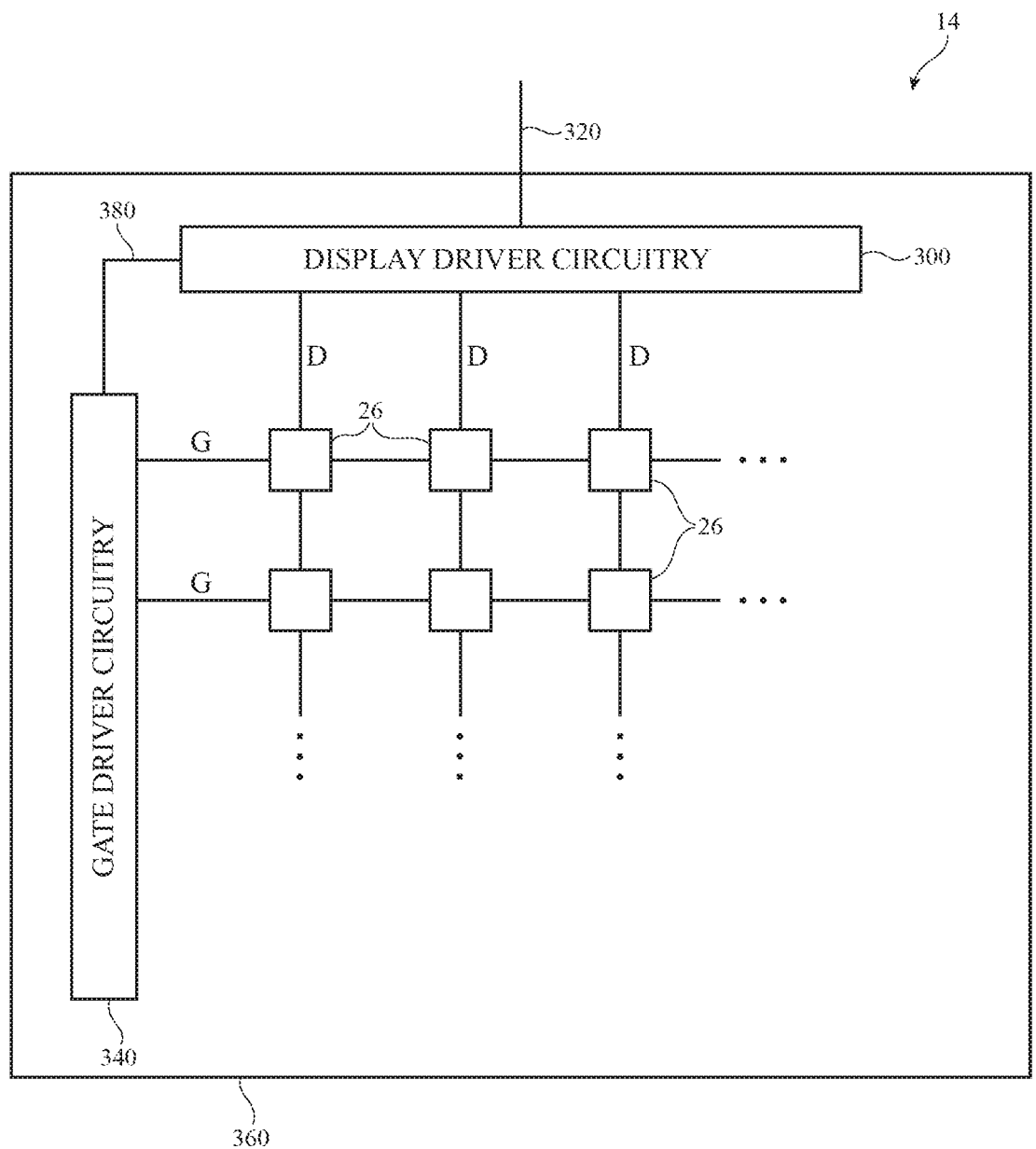
FIG. 4 is a diagram of an illustrative display with an array of display pixels in accordance with an embodiment.

A top view of a portion of display 14 is shown in FIG. 4. Display 14 may have a rectangular shape (i.e., display 14 may have a rectangular footprint and a rectangular peripheral edge that runs around the rectangular footprint) or may have other suitable shapes. Display 14 may be planar or may have a curved profile. As shown in FIG. 4, display 14 may have an array of display pixels 26 formed on a substrate 360. Substrate 360 may be formed from glass, metal, plastic, ceramic, porcelain, or other substrate materials. Pixels 26 may receive data signals over signal paths such as data lines D and may receive one or more control signals over control signal paths such as horizontal control lines G (sometimes referred to as gate lines, scan lines, emission lines, etc.). There may be any suitable number of rows and columns of pixels 26 in display 14 (e.g., tens, hundreds, or thousands of pixels 26). Pixels 26 may be implemented using any suitable type of display technology (e.g., using organic light-emitting diode display technology, liquid crystal display technology, electrophoretic display technology, plasma display technology, electrowetting display technology, MEMs display technology, etc.).

Display driver circuitry 300 may be used to control the operation of pixels 26. The display driver circuitry 300 may be formed from integrated circuits, thin-film transistor circuits, or other suitable electronic circuitry. Display driver circuitry 300 of FIG. 4 may contain communications circuitry for communicating with system control circuitry such as control circuitry 16 of FIG. 1 over path 320. Path 320 may be formed from traces on a flexible printed circuit or other cable. During operation, the control circuitry (e.g., control circuitry 16 of FIG. 1) may supply circuitry 300 with information on images to be displayed on display 14.

To display the images on display pixels 26, display driver circuitry 300 may supply image data to data lines D (e.g., data lines that run down the columns of pixels 22) while issuing clock signals and other control signals to supporting display driver circuitry such as gate driver circuitry 340 over path 380. If desired, display driver circuitry 300 may also supply clock signals and other control signals to gate driver circuitry 340 on an opposing edge of display 14 (e.g., the gate driver circuitry may be formed on more than one side of the display pixel array).

Gate driver circuitry 340 (sometimes referred to as horizontal line control circuitry or row driver circuitry) may be implemented as part of an integrated circuit and/or may be implemented using thin-film transistor circuitry. Horizontal/ row control lines G in display 14 may carry gate line signals, scan line control signals, emission enable control signals, and/or other horizontal control signals for controlling the pixels in each row. There may be any suitable number of horizontal control signals per row of pixels 26 (e.g., one or more row control lines, two or more row control lines, three or more row control lines, four or more row control lines, five or more row control lines, etc.).

Figure 5:
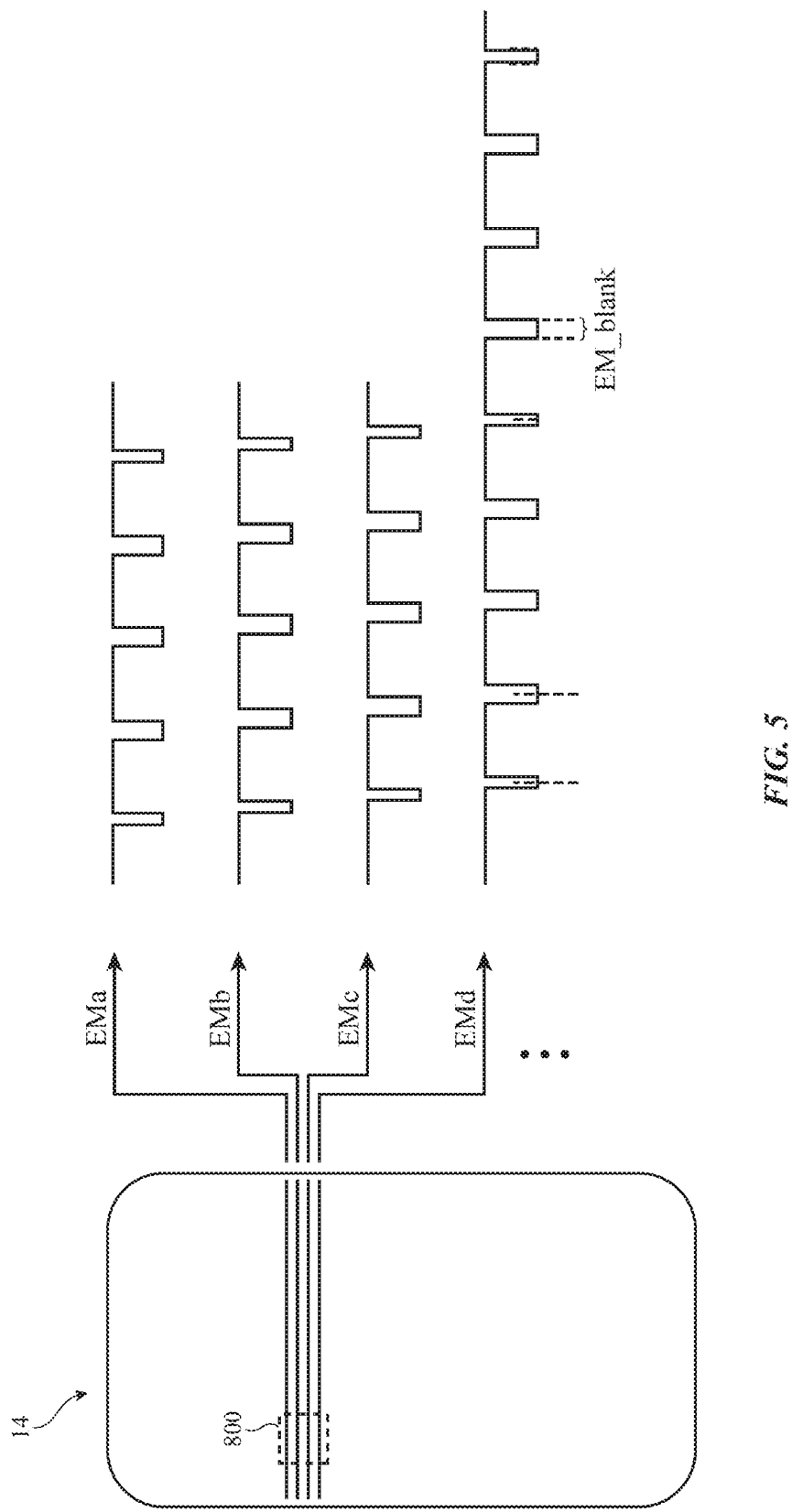
FIG. 5 is a diagram showing how a display may be driven using a series of pulse-width-modulated emission control signals with emission blanking periods in accordance with an embodiment.

Exemplary embodiments in which the display pixel array is driven using emission control signals provided over horizontal emission lines are sometimes described herein as an example. FIG. 5 is a diagram showing how display 14 may be driven using a series of pulse-width-modulated emission control signals with emission blanking periods in accordance with an embodiment. As shown in FIG. 5, a first row of pixels in the display may be controlled using a first emission signal EMa, a second row of pixels in the display may be controlled by a second emission signal EMb, a third pixel row in the display may be driven using a third emission signal EMc, a fourth pixel row may be provided with a fourth emission signal EMd, and so on. These emission control signals control when display 14 is allowed to produce light. For example, when the emission signal is asserted (e.g., driven high), the corresponding row of pixels will emit light. When the emission signal is deasserted (e.g., driven low), the corresponding row of pixels will not emit light.

The emission signals typically toggle at some predetermined operating frequency, and the duty cycle of the emission (EM) signals can be adjusted to control the brightness of the display. For example, increasing the EM duty cycle by lengthening the duration of the high phase period would increase the display brightness, whereas reducing the EM duty cycle by shortening the duration of the high phase period would decrease the display brightness. In other words, the brightness of display 14 may be adjusted by controlling or modulating the pulse width of the emission signals. The EM signals are therefore sometimes referred to as pulse-width-modulated (PWM) display brightness control signals.

In the example of FIG. 5, the emission control signals for the different pixel rows may be generated using gate driver circuits connected in a chain. The chain of gate driver circuits may be configured to receive a gate start pulse, which causes the gate driver circuit in the first row to start toggling its EM output. Each successive gate driver circuit in the chain may be triggered by the preceding gate driver circuit and as a result, the EM signals may have a slight phase offset from one row to another. Still referring to FIG. 5, the time interval during which an emission signal is deasserted signifies a period during which the pixels in that row are turned off and is therefore sometimes referred to as an emission "blanking" period EM_blank. Ambient light sensing operations may occur only during the EM_blank periods to prevent any interference or crosstalk that can otherwise originate from the display pixels above the ambient light sensor.

Figure 6:
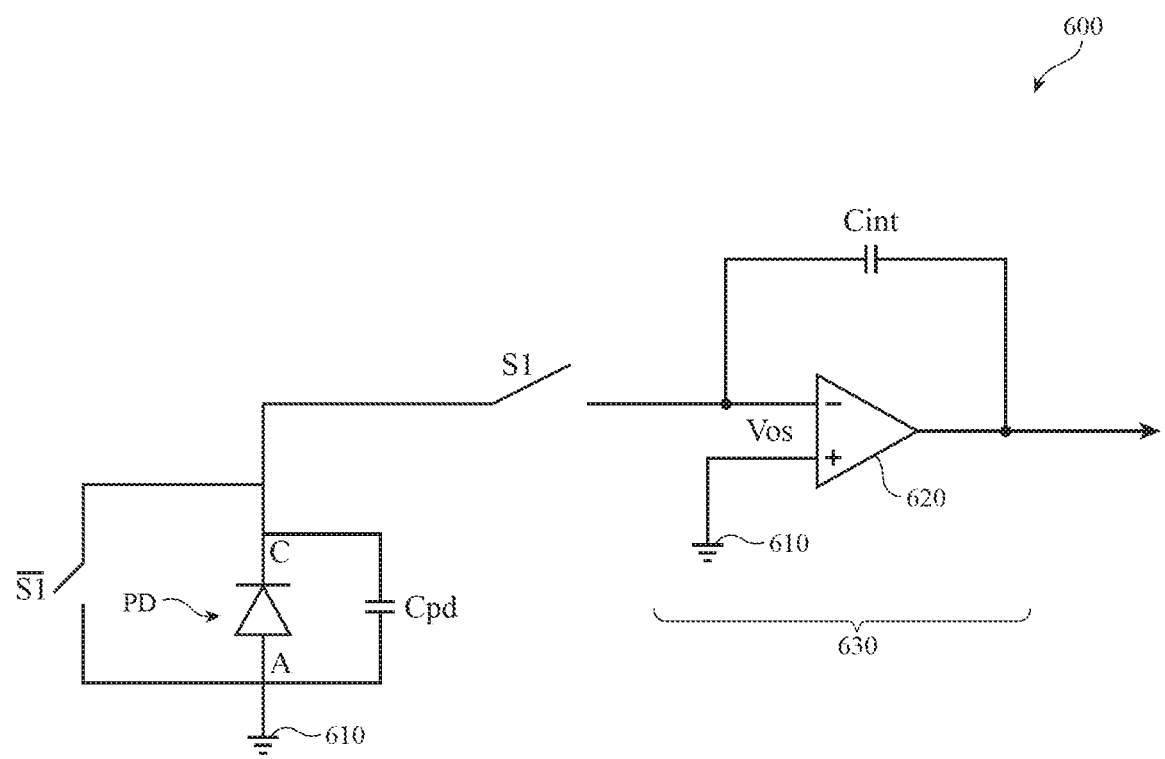
FIG. 6 is a circuit diagram of an ambient light sensor configured to support a hold function, where an amplifier offset might be injected into a photosensitive portion of the ambient light sensor.

FIG. 6 is a circuit diagram of an ambient light sensor 600 that can be used to perform ambient light sensing during emission blanking periods. During non-blanking periods when the display is on, ambient light sensor 600 is in a "hold" or idle state. During blanking periods when the display is off, ambient light sensor 600 is switched into use to integrate charge. This type of ambient light sensing operation is sometimes referred to as having "hold function" capability.

As shown in FIG. 6, ambient light sensor 600 includes a photodiode PD having an anode (A) terminal connected to a ground line 610 or a reference voltage same as the positive (+) terminal of amplifier 620 and a cathode (C) terminal coupled to a negative (−) input port of amplifier 620 via a sampling switch controlled by signal S1. Photodiode PD may have an associated parasitic capacitance Cpd. Amplifier 630 has a positive (+) input port shorted to the ground line 610 or a reference voltage similar to the anode of light sensor 600. An integrating capacitor Cint is coupled across the negative input port and the output port of amplifier 620. Arranged in this way, the combination of amplifier 620 and integrating capacitor Cint serves collectively as a charge integrator 630. Ideally, amplifier 620 should have a zero input offset. In practice, however, amplifier 620 will oftentimes exhibit a non-zero input offset voltage amount Vos even after auto-zeroing and other offset voltage canceling operations. Input offset voltage Vos is sometimes defined as the differential DC (direct current) voltage required at the inputs of the amplifier to force the amplifier output to zero.

When the display is on (i.e., during the hold phase), signal S1 is deasserted which turns off the sampling switch. During this time, a shorting switch controlled by signal /S1 will be turned on to maintain the voltage across the photodiode at 0 V. Signal /S1 may be an inverted version of signal S1. Since the sampling switch is off, any charge collected at the photodiode cannot flow to amplifier 620 and is simply discharged through the shorting switch. If desired, the shorting switch could be omitted from ambient light sensor 600, and the photodiode would simply be electrically floating during the hold period.

When the display is turned off (i.e., during the emission blanking phase), signal S1 is asserted which turns on the sampling switch. During this time, the shorting switch controlled by signal /S1 will be turned off, and charge collected at photodiode PD will be allowed to integrated at integrator 630. Activating the sampling switch will also apply the amplifier input offset voltage Vos seen at the negative input terminal of amplifier 620 across the photodiode (i.e., the voltage at the photodiode will be biased to Vos). In other words, every time the sampling switch is enabled, the voltage across the photodiode will change from close to 0 V to some non-zero Vos level, and a charge amount equal to −Vos*Cpd will be injected into the integrator 630. Charge injected as a result of Vos in this way will skew the resulting ambient light sensor output, which can degrade the accuracy of ambient light sensor 600 and cause the overall electronic device to overly dim the display or overly brighten the display in normal usage scenarios.

Figure 7A:
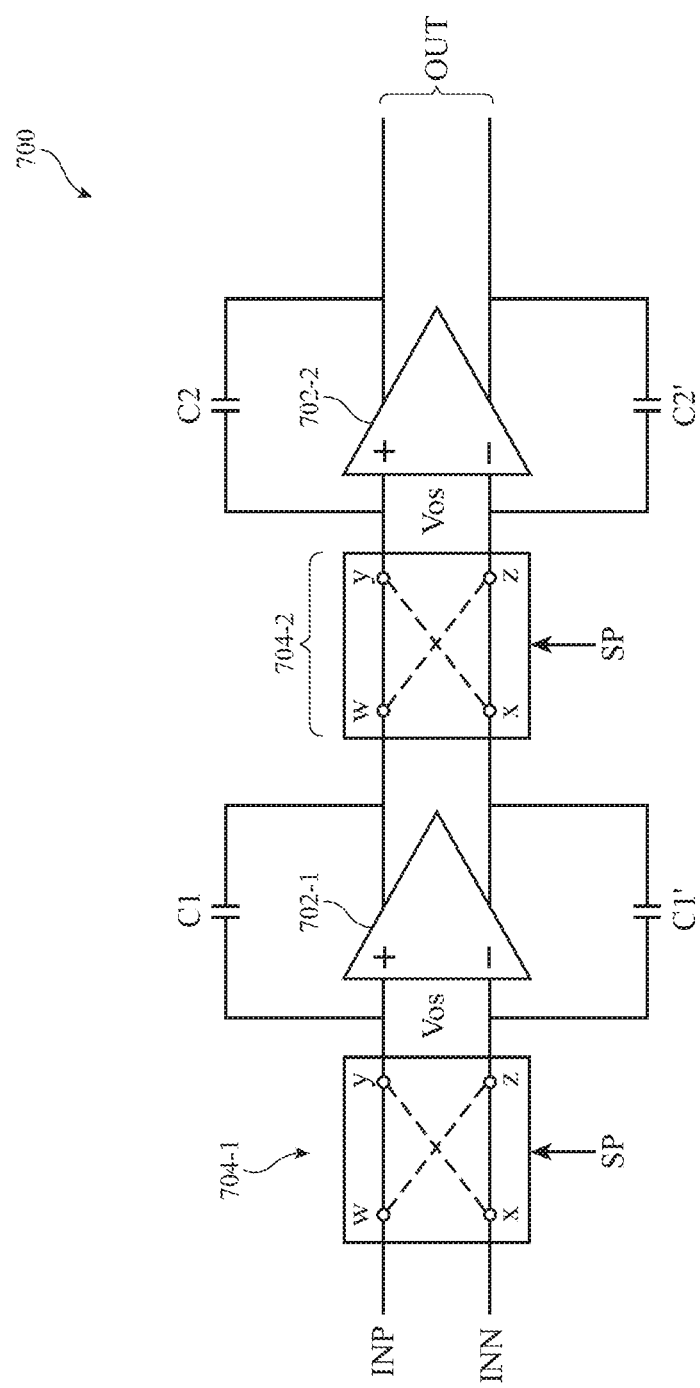
FIG. 7A is a circuit diagram of an illustrative two-stage ambient light sensor integrator with input swapping circuitry configured to average out and mitigate offset voltage charge injection in accordance with an embodiment.

In accordance with an embodiment, an integrator circuit such as integrator 700 is provided that is configured to average out and effectively cancel out the effects of offset voltage Vos (see, e.g., FIG. 7A). As shown in FIG. 7, integrator 700 may have a differential architecture that includes at least first and second integrating stages coupled in series. Integrator 700 may have differential inputs INP and INN that are coupled to a photodetector (e.g., photodiode) of the type shown in FIG. 6 via an optional input sampling switch.

The first integrating stage of integrator block 700 may include a first input swapping circuit 704-1, a first differential amplifier 702-1, a first capacitor C1 coupled across the positive (+) input terminal and a first output of amplifier 702-1, and a second capacitor C1' coupled across the negative (−) input terminal and a second output of amplifier 702-1. In particular, input swapping circuit 704-1 may have two input ports w and x and two output ports y and z. The polarity of swapping circuit 704-1 may be controlled by switch polarity control signal SP. When signal SP is asserted (e.g., when SP is driven high), port w may be connected to port y while port x is connected to port z, as shown by the solid connection paths. When signal SP is deasserted (e.g., when SP is driven low), port w may be connected to port z while port x is connected to port y, as shown by the dotted connection paths. An input swapping circuit configured in this way is sometimes referred to as an input chopper circuit.

The second integrating stage of integrator block 700 may include a second input swapping circuit 704-2, a second differential amplifier 702-2, a first capacitor C2 coupled across the positive (+) input terminal and a first output of amplifier 702-2, and a second capacitor C1' coupled across the negative (−) input terminal and a second output of amplifier 702-2. In particular, input swapping circuit 704-2 may have two input ports w and x and two output ports y and z. The capacitance of C1, C1', C2, and C2' may all be the same or may optionally be different. The polarity of swapping circuit 704-2 may also be controlled by switch polarity control signal SP. When signal SP is asserted (e.g., when SP is driven high), port w may be connected to port y while port x is connected to port z, as shown by the solid connection paths. When signal SP is deasserted (e.g., when SP is driven low), port w may be connected to port z while port x is connected to port y, as shown by the dotted connection paths. Since input swapping circuits 704-1 and 704-2 are both controlled by the same polarity signal SP, circuits 704-1 and 704-2 will switch in sync with one another.

FIG. 7B is a timing diagram showing illustrative signal waveforms for operating integrator 700 of the type shown in FIG. 7A. Signal EMx represents the emission control signal for a given row x. Signal S1 is the signal that controls the input sampling switch (e.g., the switch coupling the photodetector to integrator 700) and may be pulsed high only during the emission blanking periods when EMx is low. As shown in FIG. 7B, input polarity swapper control signal SP may be asserted prior to the first EM_blank period, deasserted prior to the second EM_blank period, asserted prior to the third EM_blank period, deasserted prior to the fourth EM_blank period, and so on in this alternating fashion. The two amplifiers 702-1 and 702-2 will still each exhibit a non-zero input offset voltage Vos, albeit small after auto-zeroing operation or other offset correction scheme is applied. Operated in this way, the charge injected into the integrator at both stages will alternate between −Vos*Cpd and +Vos*Cpd, which will average out if the hold occurrence is set to an even number. In other words, there should be an even number of EM_blank periods such that every negative Vos injection is counterbalanced by a positive Vos injection. In another suitable arrangement, the input polarity swapper control signal may toggle prior to every third EM_blank period (see SP' waveform), prior to every fifth EM_blank period (see SP" waveform), or at other suitable periodicity so long as the total number of swaps is an even number.

The example of FIGS. 7A and 7B in which a two-stage integrator with an input swapping mechanism is used to effectively mitigate amplifier input offset Vos is merely illustrative and is not intended to limit the scope of the present embodiments. If desired, integrator 700 may include three stages configured to inject alternating +/−Vos over an odd number of input swaps, four stages configured to inject alternating +/−Vos over an even number of input swaps, or any suitable number of stages that is able to average out and cancel Vos over time. In other suitable arrangements, the second stage need not be an integrating stage and may instead be a comparator without any feedback capacitors, an amplifier buffer, or some other driver stage, so long as the input and output of the first integrating stage each have a polarity swapping circuit for interchanging the signal routing. Amplifiers, comparators, and buffers can all be considered driver circuits. In other words, at least one of the two stages should be an integrating stage. In yet another suitable arrangement, the second stage might be an integrating stage while the first stage only includes a comparator, an amplifier buffer, or some other input driver stage, so long as the input and output of the second integrating stage each have a polarity swapping circuit for alternating the signal routing.

Figure 8:
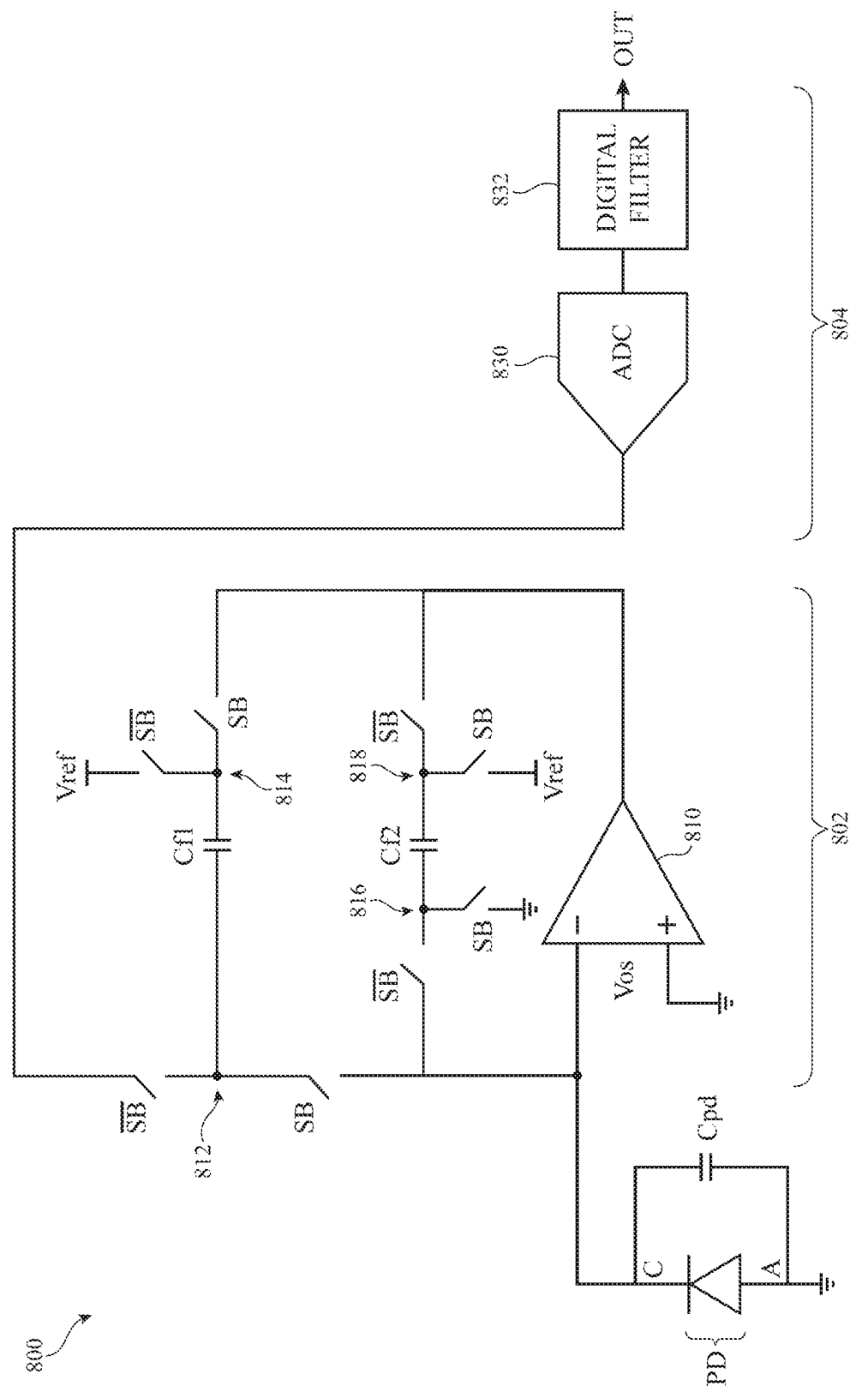
FIG. 8 is a circuit diagram of an illustrative ambient light sensor having a two-stage ambient light sensor integrator configured to accumulate charge in the digital domain in accordance with an embodiment.

In accordance with another suitable embodiment, an ambient light sensor such as ambient light sensor 800 is provided that includes a first integrator stage for selectively applying input offset voltage Vos to the photodiode while passing the integrated charge of interest to a subsequent accumulation stage (see, e.g., FIG. 8). As shown in FIG. 8, ambient light sensor 800 may include a photosensitive element such as a photodiode PD with an associated parasitic capacitance Cpd, a first integration stage 802, and a second accumulation stage 804.

The first integration stage 802 may include an operational amplifier such as amplifier 810 have a positive (+) input terminal shorted to ground, a negative (−) input terminal directly connected to the cathode terminal of the photodiode PD, and an output terminal. Stage 802 may further include a first feedback capacitor Cf1 having a first terminal at node 812 that is selectively coupled to the negative input terminal of amplifier 810 via a first switch controlled by switch blanking control signal SB and a second terminal at node 814 that is selectively coupled to the output of amplifier 810 via a second switch also controlled by signal SB. Node 814 also selectively receives a reference voltage Vref via a third switch controlled by signal /SB. Signal /SB is an inverted version of signal SB. The anode of the photodiode and the positive (+) terminal of amplifier 810 may be connected to a suitable reference voltage instead of ground.

First stage 802 may further include a second feedback capacitor Cf2 having a first terminal at node 816 that is selectively coupled to the negative input terminal of amplifier 810 via a fourth switch controlled by signal /SB and a second terminal at node 818 that is selectively coupled to the output of amplifier 810 via a fifth switch also controlled by signal /SB. Node 816 is selectively shorted to ground or a reference voltage via a sixth switch controlled by signal SB, whereas node 818 selectively receives reference voltage Vref via a seventh switch also controlled by signal SB. Node 812 may be selectively coupled to the second accumulator stage 804 via an eighth switch controlled by signal /SB. The accumulator stage 804 may include an analog-to-digital converter (ADC) 830 and a digital filter circuit 832 (e.g., a digital accumulator circuit).

Figure 9:
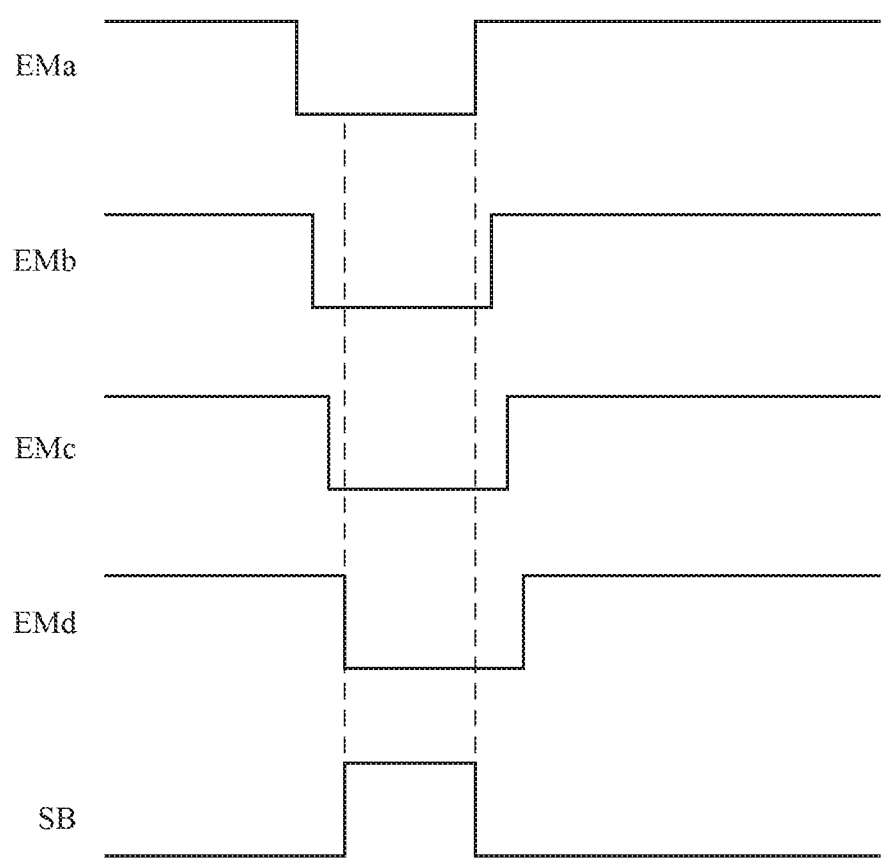
FIG. 9 is a timing diagram showing illustrative signal waveforms for operating the integrator shown in FIG. 8 in accordance with an embodiment.

FIG. 9 is a timing diagram showing illustrative signal waveforms for operating 800 integrator of the type described in connection with FIG. 8. Consider a scenario in which the ambient light sensor 800 is positioned immediately below display pixel rows a, b, c, and d (see, e.g., FIG. 5). Thus, it is possible that the emission signals EMa, EMb, EMc, and EMd associated with these rows can cause the display to potentially generate stray light interfering with the accuracy of ambient light sensor 800. Since there is a non-zero temporal phase offset between each successive EM signal, it may be desirable to assert the switch blanking control signal SB only when emission signals EMa, EMb, EMc, and EMd are all low, which is when the display pixels of the associated rows are all turned off in the blanking phase. The gate driver circuitry 340 (FIG. 4) will know when this occurs and may therefore be responsible for generating control signal SB. This example where signal SB is pulsed high when four consecutive EM signals are all deasserted is merely illustrative. In other suitable arrangements, ambient light sensor 800 may overlap with a different number of rows, and control signal SB will be generated based on the emission control signals for that number of rows.

Configured and operated in the way shown in FIGS. 8 and 9, a double integration scheme for mitigating amplifier offset voltage Vos is provided. During the blanking time (e.g., when signal SB is high), the corresponding switches in stage 802 that are controlled by signal SB will be turned on, and the photodiode current will be integrated across feedback capacitor Cf1. During this time, reference voltage Vref will be stored across feedback capacitor Cf2. Capacitor Cf1 is therefore configured to hold "good" charge (i.e., charge of interest integrated from photodiode PD) gathered during the blanking period. Since capacitor Cf1 closes the amplifier feedback look, input offset voltage Vos will be applied to the photodiode PD during the blanking period.

During the non-blanking time (e.g., when signal SB is low), the corresponding switches in stage 802 that are controlled by signal SB will be turned off while the switches controlled by signal /SB will be turned on, which allows the charge stored across capacitor Cf1 to be forwarded to the second stage 804 for digital conversion and accumulation in the digital domain using digital filter 832. During this time, reference voltage Vref may be applied to feedback capacitor Cf1. Since capacitor Cf1 is no longer connected in a feedback loop, another connection is needed to maintain the feedback configuration. If no feedback connection is implemented, offset voltage Vos will not be applied to the photodiode PD and −Vos*Cpd charge injection will occur to skew the results. To prevent this from happening, capacitor Cf2 may be coupled across amplifier 810 during the non-blanking period. Capacitor Cf2 configured and operated in this way therefore serves as a sacrificial capacitor that is not used to store good charge but rather used to close the amplifier feedback loop while the display is on to ensure that Vos is continuously applied to across the photodiode parasitic capacitance Cpd. Any photodiode current integrated across capacitor Cf2 during the non-blanking time will subsequently be discharged using reference voltage Vref during blanking time. Since capacitor Cf1 is used to store charge during the blanking time, the size of capacitor Cf1 can be reduced relatively to Cf2 to improve noise.

Figure 10:
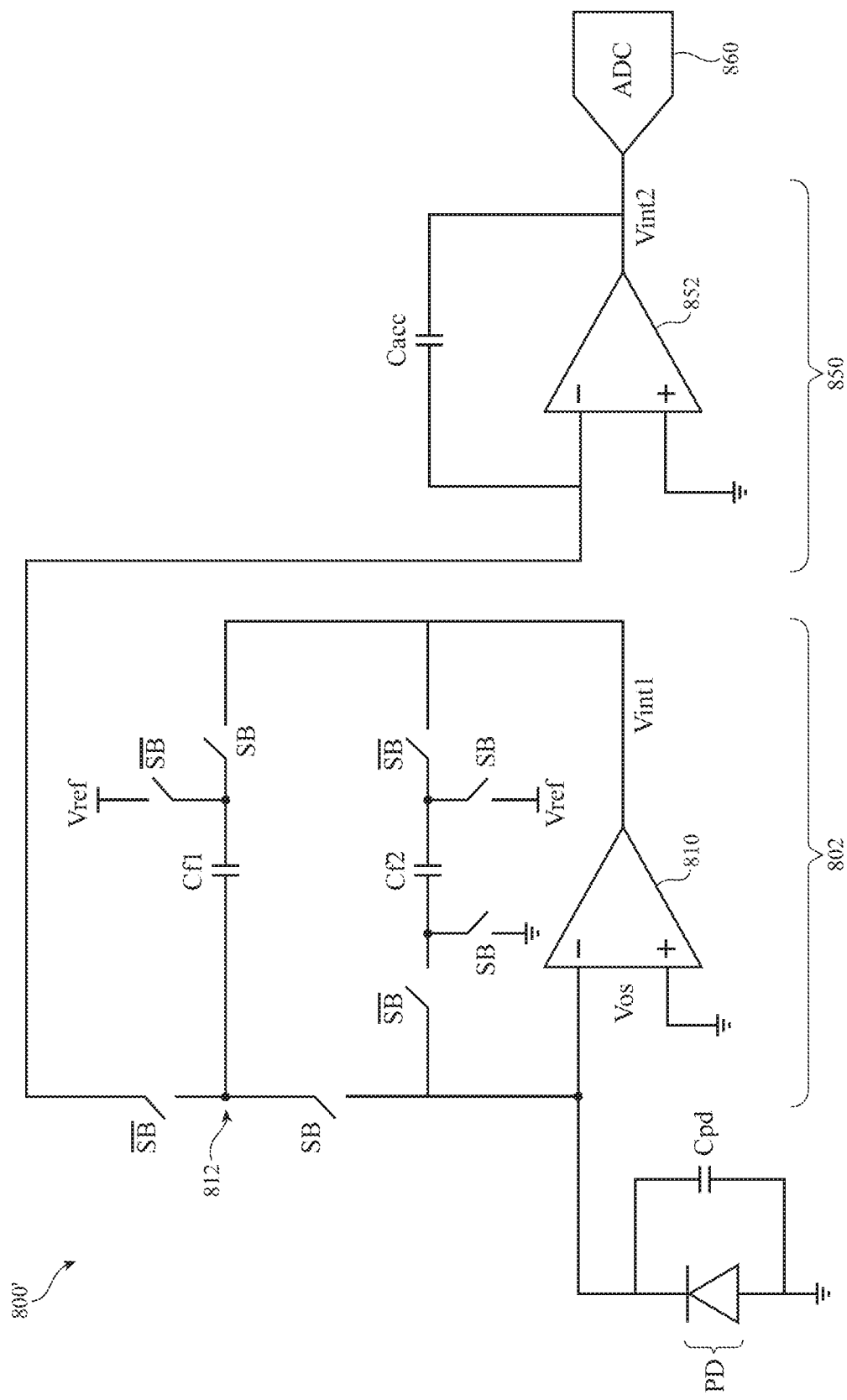
FIG. 10 is a circuit diagram of an illustrative ambient light sensor having a two-stage ambient light sensor integrator configured to accumulate charge in the analog domain in accordance with an embodiment.

The example of FIGS. 8 and 9 where integrator 800 is configured to accumulate charge in the digital domain at the second stage is merely illustrative and is not intended to limit the scope of the present embodiments. FIG. 10 illustrates another suitable arrangement in which ambient light sensor 800' is configured to accumulate charge in the analog domain. As shown in FIG. 10, ambient light sensor 800' may include a first integrator stage 802 for selectively applying input offset voltage Vos to the photodiode while passing the good charge to a subsequent analog accumulation stage 850.

The first integrator stage 802 in ambient light sensor 800' may be structurally and functionally similar to that of ambient light sensor 800 of FIG. 8, so the details need not be repeated. Amplifier 810 in the first stage has an output on which a first integration voltage Vint1 is generated. Node 812 may be selectively coupled to the second accumulator stage 850 via an additional switch controlled by signal /SB. The accumulator stage 850 may include a second amplifier 852 having a positive (+) input terminal connected to ground, a negative (−) input terminal selectively coupled to node 812 of the first integrating stage 802, and an output that is coupled to its negative input terminal via an accumulation capacitor Cacc. Configured in this way, the second stage 850 may serve as an integrator block that accumulates transferred from the first integrator stage 802 in the analog domain. The final integrated voltage Vint2 provided at the output of the second stage 850 can then be converted to a corresponding digital value using analog-to-digital converter 860.

Figure 11:
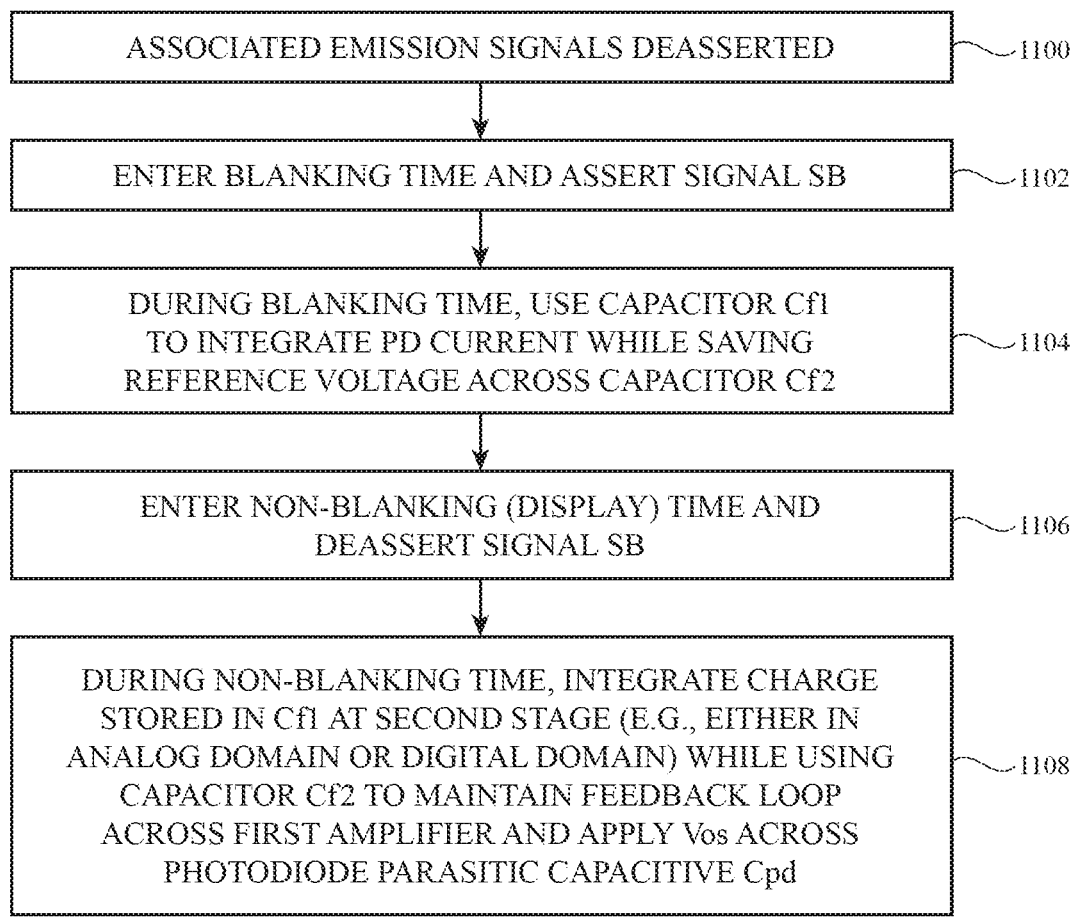
FIG. 11 is a flow chart of illustrative steps for operating an ambient light sensor of the type shown in FIGS. 8-10 in accordance with an embodiment.

FIG. 11 is a flow chart of illustrative steps for operating an ambient light sensor of the type described in connection with FIGS. 8-10. At step 1100, the emission signals for a subset of rows overlapping with the ambient light sensor may be deasserted to enter an emission blanking time during which the pixels in those rows are turned off. At step 1102, when all of the emission signals for that subset of rows are all low, blanking control signal SB may be asserted (e.g., driven high).

During blanking time (at step 1004), the first feedback capacitor Cf1 in the first stage may be used to integrate photodiode current while saving a reference voltage level across the second feedback capacitor Cf2 in the first stage. At the end of the blanking time, signal SB may be deasserted and the associated display pixel rows may begin emitting light.

During non-blanking time, the charge stored in first feedback capacitor Cf1 may be integrated at the second stage (e.g., either in the digital domain as illustrated in FIG. 8 or in the analog domain as illustrated in FIG. 10). During this time, the second feedback capacitor Cf2 may be used to maintain the negative feedback loop across the amplifier in the first stage. Configured in this way, the amplifier input offset voltage Vos will be effectively applied across the photodiode (and the parasitic capacitance Cpd) so that no undesired charge injection will occur during the transition time between non-blanking/blanking intervals.

The embodiments presented above describe display configurations that use emission signals to control the display (non-blanking) and non-display (blanking) time periods. This is merely illustrative. In general, the techniques described herein may be applied to displays that use other types of control signals to manage when the display is turned on or turned off. So long as the ambient light sensor is switched into use only during the blanking periods when the relevant rows in the display is turned off and no input offset voltage is injected into the photodiode during the transition between blanking and non-blanking periods, the ambient light sensor will be able to output accurate results without display interference and crosstalk.

The foregoing is merely illustrative and various modifications can be made to the described embodiments. The foregoing embodiments may be implemented individually or in any combination.

What is claimed is:

1. An electronic device, comprising:
a display having rows of pixels; and
an ambient light sensor at least partially overlapping with the display, wherein the ambient light sensor comprises:
a photosensitive element;
an integrating stage having an amplifier, a first feedback capacitor selectively coupled across the amplifier, and a second feedback capacitor selectively coupled across the amplifier, wherein the integrating stage is configured to integrate charge generated from the photosensitive element during a blanking period when at least some of the rows in the display overlapping with the ambient light sensor are not emitting light; and an accumulation stage configured to receive signals from the integrating stage.

2. The electronic device of claim 1, wherein the charge integrated at the integrating stage during the blanking period is transferred to the accumulation stage during a non-blanking period when the at least some of the rows in the display overlapping with the ambient light sensor are emitting light.

3. The electronic device of claim 2, wherein the accumulation stage is configured to accumulate charge transferred from the integrating stage in a digital domain.

4. The electronic device of claim 2, wherein the accumulation stage is configured to accumulate charge transferred from the integrating stage in an analog domain.

5. The electronic device of claim 2, wherein the amplifier has an input offset voltage, and wherein the input offset voltage is applied to the photosensitive element during both the blanking period and the non-blanking period to prevent undesired charge from being injected into the photosensitive element during a transition between the blanking period and the non-blanking period.

6. The electronic device of claim 1, wherein the first feedback capacitor is configured to integrate charge generated from the photosensitive element during the blanking period.

7. The electronic device of claim 6, wherein a reference voltage is applied to the second feedback capacitor during the blanking period.

8. The electronic device of claim 6, wherein the charge integrated at the first feedback capacitor is transferred to the accumulation stage during a non-blanking period, and wherein the second feedback capacitor is used to maintain a feedback loop across the amplifier during the non-blanking period.

9. The electronic device of claim 1, wherein the second feedback capacitor is used to maintain the input offset voltage at the photosensitive element during a non-blanking period.

10. A method of operating an electronic device having a display and an ambient light sensor at least partially covered by the display, the method comprising:
    during a non-blanking time, activating at least some pixel rows in the display overlapping with the ambient light sensor to emit light;
    during a blanking time, deactivating the at least some pixels rows in the display overlapping with the ambient light sensor;
    using a photodetector in the ambient light sensor to detect light;
    using an integrator stage in the ambient light sensor to integrate charge generated by the photodetector during the blanking time, wherein the integrator stage comprises an amplifier with an input offset voltage; and
    applying, using a first capacitor, the input offset voltage of the amplifier to the photodetector during the blanking time and applying, using a second capacitor, the input offset voltage of the amplifier to the photodetector during the non-blanking time to prevent input offset voltage dependent charge from being injected onto the photodetector.

11. The method of claim 10, further comprising:
transferring the charge integrated at the integrator stage to an accumulation stage in the ambient light sensor during the non-blanking time.

12. The method of claim 10, further comprising:
using the first capacitor in the integrator stage to maintain a first feedback loop across the amplifier during the blanking time.

13. The method of claim 12, further comprising:
using the second capacitor in the integrator stage to maintain a second feedback loop across the amplifier during the non-blanking time.

14. The method of claim 13, further comprising:
applying a reference voltage to the first capacitor during the non-blanking time; and
applying the reference voltage to the second capacitor during the blanking time.

15. An electronic device, comprising:
a display; and
an ambient light sensor formed under the display, wherein the ambient light sensor comprises:
    a differential amplifier having an input and an input offset voltage;
    integration capacitors coupled across the differential amplifier;
    an input swapping circuit coupled at the input of the differential amplifier, wherein the input swapping circuit is configured to swap signals arriving at the differential amplifier in an alternating fashion to average and cancel out the input offset voltage of the differential amplifier;
    a driver stage coupled in series with the differential amplifier; and
    an additional input swapping circuit interposed between the differential amplifier and the driver stage.

16. The electronic device of 15, wherein the input swapping circuit and the additional input swapping circuit are adjusted using a same control signal.

17. The electronic device of claim 16, wherein the control signal toggles only an even number of times.

* * * * *

UNITED STATES PATENT AND TRADEMARK OFFICE
CERTIFICATE OF CORRECTION

PATENT NO. : 10,984,732 B2
APPLICATION NO. : 16/580150
DATED : April 20, 2021
INVENTOR(S) : Dong Zheng, Ali Motamed and Anand K. Chamakura It is certified that error appears in the above-identified patent and that said Letters Patent is hereby corrected as shown below:

In the Claims

Column 14, Line 47, "device of 15" should read -- device of claim 15 --

Signed and Sealed this
Eighth Day of June, 2021

Drew Hirshfeld
*Performing the Functions and Duties of the*
*Under Secretary of Commerce for Intellectual Property and*
*Director of the United States Patent and Trademark Office*